(12) United States Patent
Glenn et al.

(10) Patent No.: US 6,777,789 B1
(45) Date of Patent: Aug. 17, 2004

(54) MOUNTING FOR A PACKAGE CONTAINING A CHIP

(75) Inventors: Thomas P. Glenn, Gilbert, AZ (US); Steven Webster, Manila (PH); Roy D. Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 22 days.

(21) Appl. No.: 10/340,256

(22) Filed: Jan. 10, 2003

Related U.S. Application Data

(63) Continuation of application No. 09/813,485, filed on Mar. 20, 2001, now Pat. No. 6,545,345.

(51) Int. Cl.[7] .............................................. H01L 23/495
(52) U.S. Cl. ........................ 257/676; 257/684; 257/666
(58) Field of Search ................................ 257/676, 684, 257/666, 690, 713, 787, 796, 667, 678, 698

(56) References Cited

U.S. PATENT DOCUMENTS

| | | |
|---|---|---|
| 2,596,993 A | 5/1952 | Gookin |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |

(List continued on next page.)

FOREIGN PATENT DOCUMENTS

| | | |
|---|---|---|
| DE | 19734794 A1 | 8/1997 |
| EP | 54021117 | 6/1979 |

(List continued on next page.)

OTHER PUBLICATIONS

JEDEC Sc'd State Product Outline 2 Lead Header Family Surface Mounted (Peripheral Terminals; 4 pages.
Mannon P 'MOSFETs Break Out of the Shackles of Wire-bonding' Electronic Design, vol. 47, #6 (Mar. 22, 1999).
Micro Electronics Packaging Handbook, 1989 ed ted by R Tummela & E Rymaszewski published by Van Nostrand Reinhold, New York, NY.
National Semiconductor Application Note 1187, 'Leacless Leadframe Package (LLP)', Oct. 2002 http://www.national.com/ao/AN:AN 1187 po.
Vishay Siliconix Press Release, http://www.siliconix.com/www/2(X)/pr98/4430.html. Dec. 9, 1998. pp. 1–3.

*Primary Examiner*—Eddie Lee
*Assistant Examiner*—Douglas W. Owens
(74) *Attorney, Agent, or Firm*—Stetina Brunda Garred & Brucker

(57) ABSTRACT

A mounting for a package containing a semiconductor chip is disclosed, along with methods of making such a mounting. The mounting includes a substrate having a mounting surface with conductive traces thereon, and an aperture extending through the substrate. The package includes a base, such as a leadframe or a laminate sheet, and input/output terminals. A chip is on a first side of the base and is electrically connected (directly or indirectly) to the input/output terminals. A cap, which may be a molded encapsulant, is provided on the first side of the base over the chip. The package is mounted on the substrate so that the cap is in the aperture, and a peripheral portion of the first side of the base is over the mounting surface so as to support the package in the aperture and allow the input/output terminals of the package to be juxtaposed with to the circuit patterns of the mounting surface. Because the cap is within the aperture, a height of the package above the mounting surface is minimized.

17 Claims, 5 Drawing Sheets

U.S. PATENT DOCUMENTS

| | | | |
|---|---|---|---|
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,707,724 A | 11/1987 | Suzuki et al. | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,029,386 A | 7/1991 | Chao et al. | |
| 5,041,902 A | 8/1991 | McShane | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,157,480 A | 10/1992 | McShane et al. | |
| 5,172,213 A | 12/1992 | Zimmerman | |
| 5,172,214 A | 12/1992 | Casto | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A * | 1/1994 | Singh Deo et al. ......... 257/666 | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,454,905 A | 10/1995 | Fogelson | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,604,376 A | 2/1997 | Hamburgen et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,644,169 A | 7/1997 | Chun | |
| 5,646,831 A | 7/1997 | Manteghi | |
| 5,650,663 A | 7/1997 | Parthasarathi | |
| 5,665,996 A | 9/1997 | Williams et al. | |
| 5,673,479 A | 10/1997 | Hawthorne | |
| 5,683,806 A | 11/1997 | Sakumoto et al. | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,736,432 A | 4/1998 | Mackessy | |
| 5,745,984 A | 5/1998 | Cole, Jr. et al. | |
| 5,753,977 A | 5/1998 | Kusaka et al. | |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,856,911 A | 1/1999 | Riley | |
| 5,859,471 A | 1/1999 | Kuraishi et al. | |
| 5,866,939 A | 2/1999 | Shin et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,398 A | 3/1999 | Low et al. | |
| 5,894,108 A | 4/1999 | Mostafazadeh et al. | |
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,917,242 A | 6/1999 | Ball | |
| 5,939,779 A | 8/1999 | Kim | |
| 5,942,794 A | 8/1999 | Okumura et al. | |
| 5,951,305 A | 9/1999 | Haba | |
| 5,959,356 A | 9/1999 | Oh | |
| 5,973,388 A | 10/1999 | Chew et al. | |
| 5,976,912 A | 11/1999 | Fukutomi et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,986,333 A | 11/1999 | Nakamura | |
| 5,986,885 A * | 11/1999 | Wyland ...................... 361/704 | |
| 6,001,671 A | 12/1999 | Fjelstad | |
| 6,013,947 A | 1/2000 | Lim | |
| 6,018,189 A | 1/2000 | Mizuno | |

| Patent Number | Date | Inventor(s) |
|---|---|---|
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,339,255 B1 | 1/2002 | Shin |
| 6,355,502 B1 | 3/2002 | Kang et al. |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 * | 5/2002 | Shin et al. .......... 438/106 |
| 6,400,004 B1 | 6/2002 | Fan et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,498,392 B2 | 12/2002 | Azuma |
| 6,545,345 B1 * | 4/2003 | Glenn et al. .......... 257/676 |
| 2001/0008305 A1 | 7/2001 | McLellan et al. |
| 2002/0011654 A1 | 1/2002 | Kimura |
| 2002/0024122 A1 | 2/2002 | Jung et al. |
| 2002/0140061 A1 | 10/2002 | Lee |
| 2002/0140068 A1 | 10/2002 | Lee et al. |

FOREIGN PATENT DOCUMENTS

| | | |
|---|---|---|
| EP | 59050939 | 3/1984 |
| EP | 0720225 | 3/1996 |
| EP | 0720234 | 3/1996 |
| EP | 0794572 A2 | 10/1997 |
| EP | 0844669 | 5/1998 |
| EP | 0936671 | 8/1999 |
| EP | 0989608 | 3/2000 |
| EP | 1032037 | 8/2000 |
| JP | 59208756 | 11/1964 |
| JP | 55163869 | 12/1980 |
| JP | 5745958 | 3/1982 |
| JP | 58150096 | 8/1983 |
| JP | 58227143 | 12/1984 |
| JP | 60010756 | 1/1985 |
| JP | 6139555 | 2/1985 |
| JP | 60116239 | 6/1985 |
| JP | 60195557 | 10/1985 |
| JP | 629639 | 1/1987 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 60231348 | 11/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312406 | 11/1995 |
| JP | 864634 | 3/1996 |
| JP | 8125065 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10199034 | 7/1998 |
| JP | 63205935 | 8/1998 |
| JP | 10256240 | 9/1998 |
| JP | 00150765 | 5/2000 |
| KR | 941979 | 1/1994 |
| KR | 199772358 | 11/1997 |
| KR | 100220164 | 6/1999 |
| KR | 0049944 | 6/2002 |
| WO | 9956316 | 11/1999 |
| WO | 9967821 | 12/1999 |

* cited by examiner

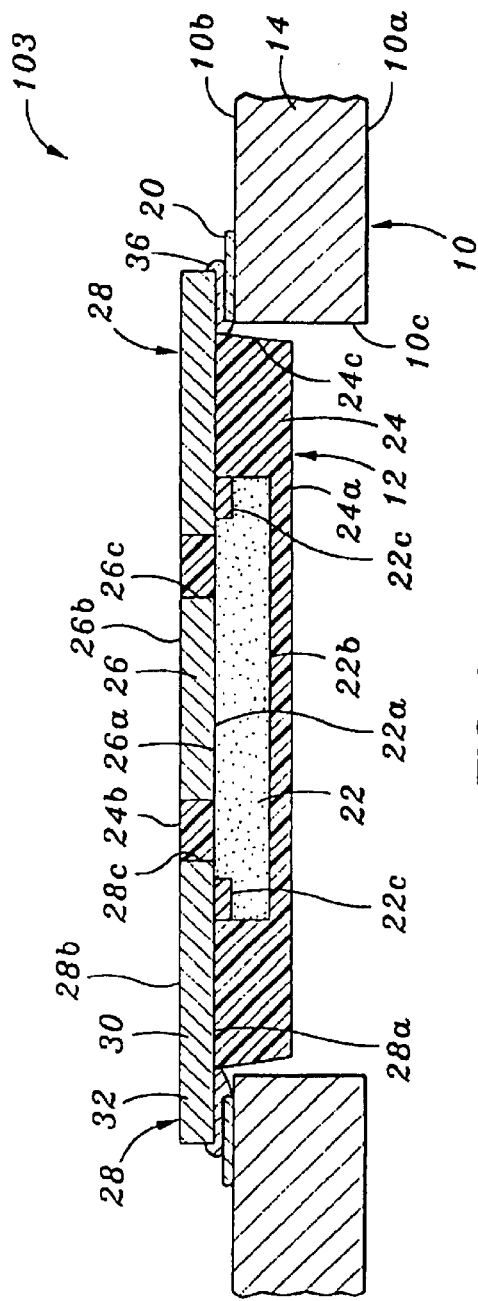
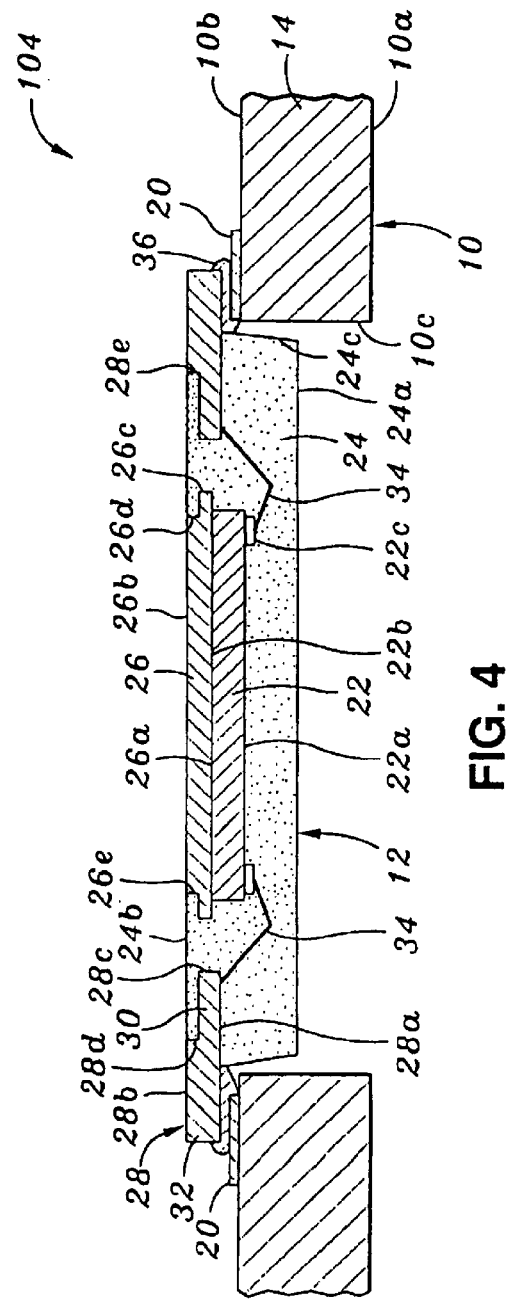
FIG. 3
FIG. 4

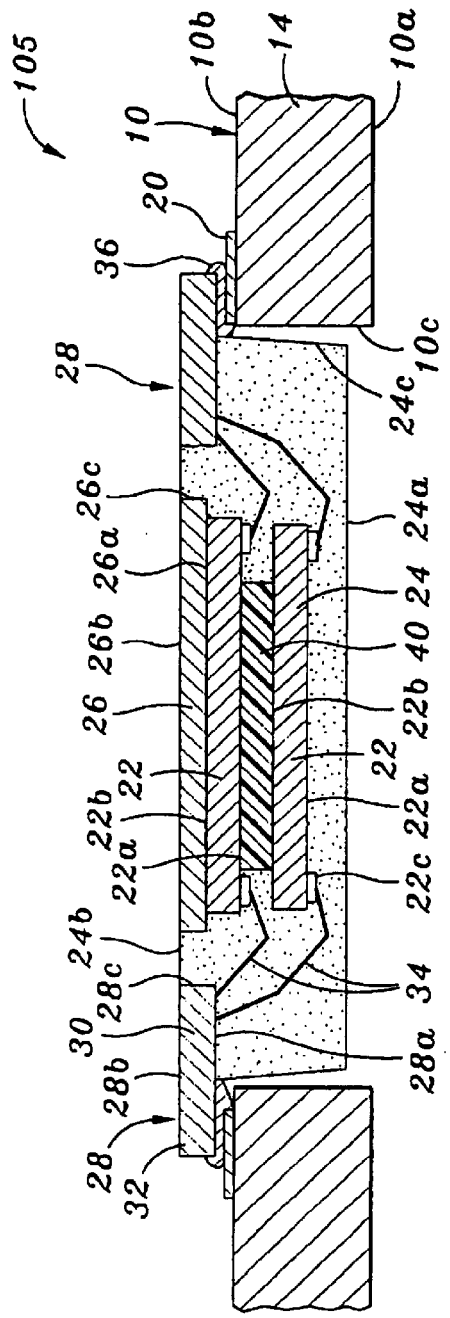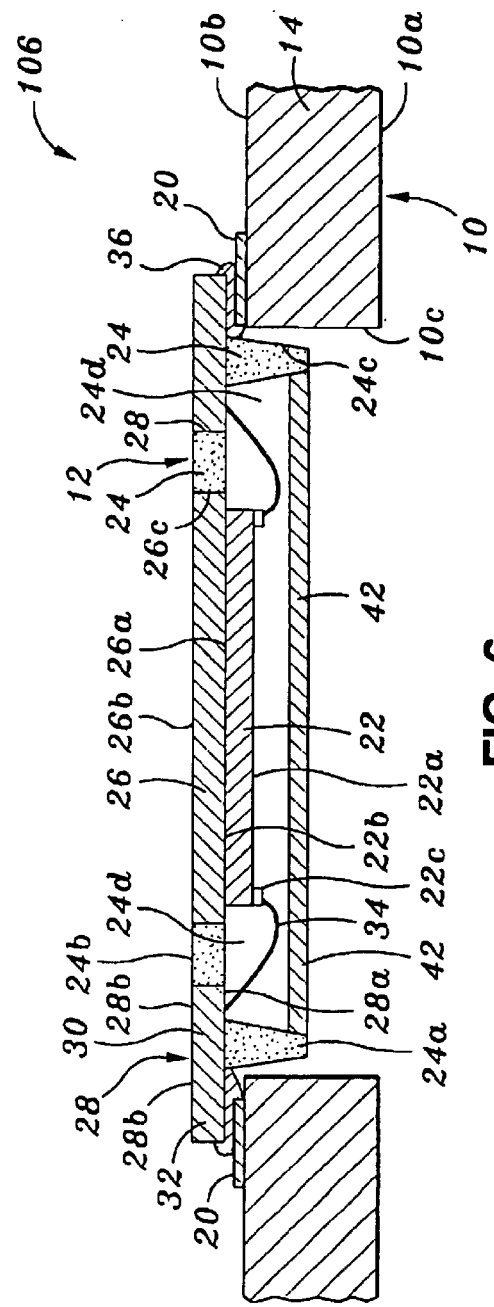

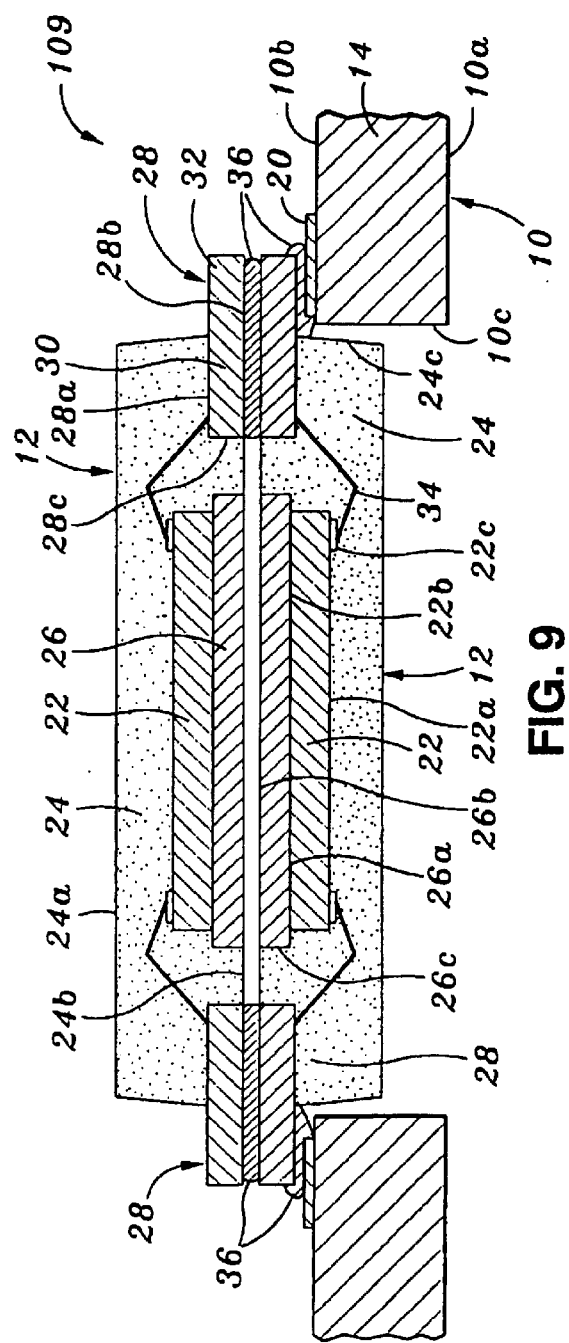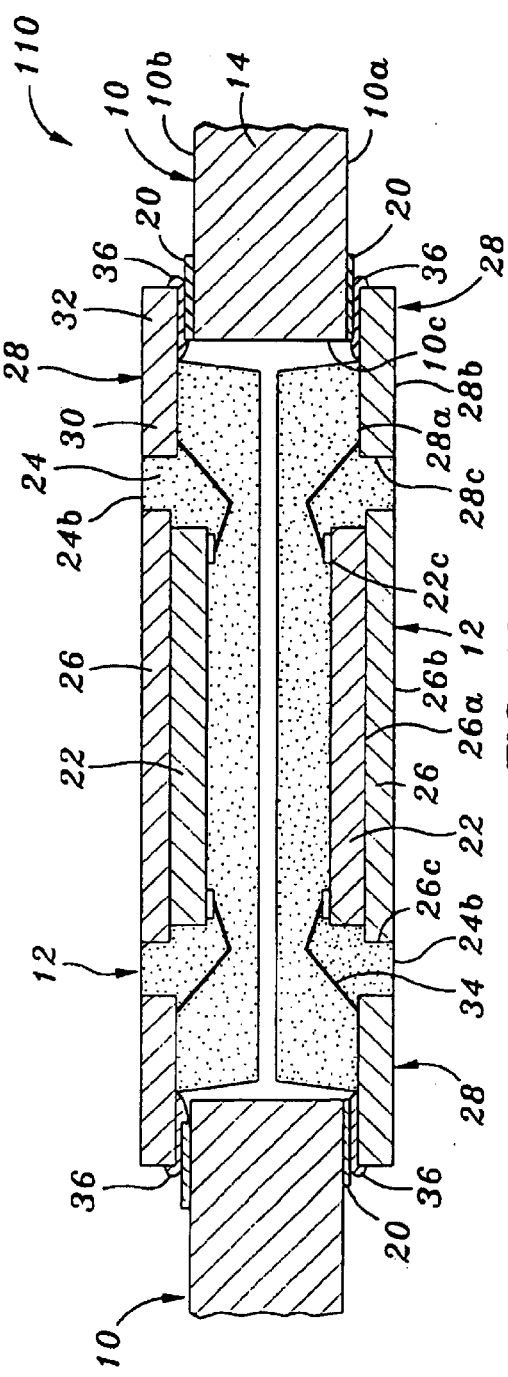

MOUNTING FOR A PACKAGE CONTAINING A CHIP

The present application is a continuation of U.S. patent application Ser. No. 09/813,485 entitled MOUNTING FOR A PACKAGE CONTAINING A CHIP filed Mar. 20, 2001 and issued as U.S. Pat. No. 6,545,345 on Apr. 8, 2003.

BACKGROUND

1. Field of the Invention

The present invention relates to a mounting for a package containing a semiconductor chip.

2. Description of the Related Art

A typical package for a semiconductor chip includes an internal leadframe, which functions as a substrate for the package. The leadframe includes a central metal die pad and a plurality of leads. A body of a hardened, insulative encapsulant material covers the die, die pad, and an inner portion of each of the leads. The encapsulant material is provided both above and below the die pad and leads.

The semiconductor chip is mounted on the die pad and is electrically connected to the leads. In particular, the chip includes a plurality of bond pads, each of which is electrically connected by a conductor (e.g., a bond wire) to an encapsulated inner portion of one of the leads. An outer portion of each lead extends outward from the body of encapsulant material, and serves as an input/output terminal for the package. The outer portion of the leads may be bent into various configurations, such as a J lead configuration or a gull wing configuration.

Customers of such packages typically mount the package on an larger substrate, such as motherboard. The outer lead portions are soldered to metal traces of a mounting surface of the motherboard. The outer lead portions space the body of encapsulant material (and accordingly the chip, die pad, bond wires, and inner leads) a vertical distance above the mounting surface. Accordingly, the package has a relatively large height above the mounting surface, which is undesirable in some applications.

Lately, practitioners have attempted to make packages thinner by providing the die pad and leads at a bottom surface of the body of encapsulant material, rather than in the middle of the body of encapsulant material. Such packages enjoy a lower height than the standard leadframe packages mentioned above, since there is no encapsulant beneath the die pad and leads. Nonetheless, the height of the package above the mounting surface may still be too great for some applications, since the encapsulant must still extend over the die. Accordingly, a solution is necessary for applications where the height of the package above the mounting surface of the motherboard must be as small as possible.

SUMMARY OF THE INVENTION

A mounting for a package containing a semiconductor chip is disclosed, along with methods of making such a mounting. The mounting includes a substrate having a mounting surface with conductive traces thereon, and an aperture extending through the substrate. The package includes a base, such as a leadframe or a metallized laminate sheet, with input/output terminals for electrically connecting the package to the traces of the mounting surface. At least one chip is provided on a first side of the base of the package. The chip is electrically connected through the package (i.e., directly or indirectly) to the input/output terminals of the package. A cap, which may be a molded encapsulant material, is provided on the first side of the base over the chip. The package is mounted on the substrate so that the cap extends into the aperture of the substrate. A circumferential portion of the first side of the base outside of the cap is juxtaposed with the mounting surface so as to support the package and allow the input/output terminals of the package to be electrically connected to juxtaposed traces of the mounting surface of the substrate. Because the cap is within the aperture, a height of the package over the mounting surface is much less than in a conventional mounting, yielding distinct advantages in applications where the height of the package over the mounting surface is critical.

Various exemplary embodiments of mountings and packages for the mountings also are disclosed herein. For example, a mounting for a stack of packages is disclosed, wherein a second package is mounted on a first package that is mounted on the substrate. Alternatively, two packages may be mounted on opposite sides of the substrate, with the cap of each package in the aperture and facing the cap of the other package. In addition, embodiments for electrically connecting the package to the traces of the substrate using clips on the substrate, or channels in the substrate, are disclosed. Such embodiments can allow for a snap-in, solderless electrical connection of the package to the substrate.

These and other features and aspects of the present invention will become clear upon a reading of the following detailed description of the exemplary embodiments, in conjunction with the accompanying drawings thereof.

BRIEF DESCRIPTION OF THE DRAWINGS

FIG. 3 is a cross-sectional side view of a mounting for an alternative package, wherein the package includes a semiconductor chip in a flip chip connection with leads of the package.

FIG. 4 is a cross-sectional side view of a mounting for an alternative package, wherein the die pad and leads of the package include a means for preventing the die pad and leads from being pulled vertically from the body of encapsulant material.

FIG. 5 is a cross-sectional side view of a mounting for an alternative package, wherein the package includes a pair of stacked, electrically interconnected chips.

FIG. 6 is a cross sectional side view of a mounting for an alternative package, wherein the package includes a central cavity for the chip and a lid over the chip.

FIG. 9 is a cross-sectional side view of another alternative mounting, wherein the mounting includes a stack of electrically interconnected packages.

FIG. 10 is a cross sectional side view of a mounting for two packages.

In the drawings, identical or similar features of the various embodiments shown therein are typically labeled with the same reference numbers.

DETAILED DESCRIPTION

Figure 1:
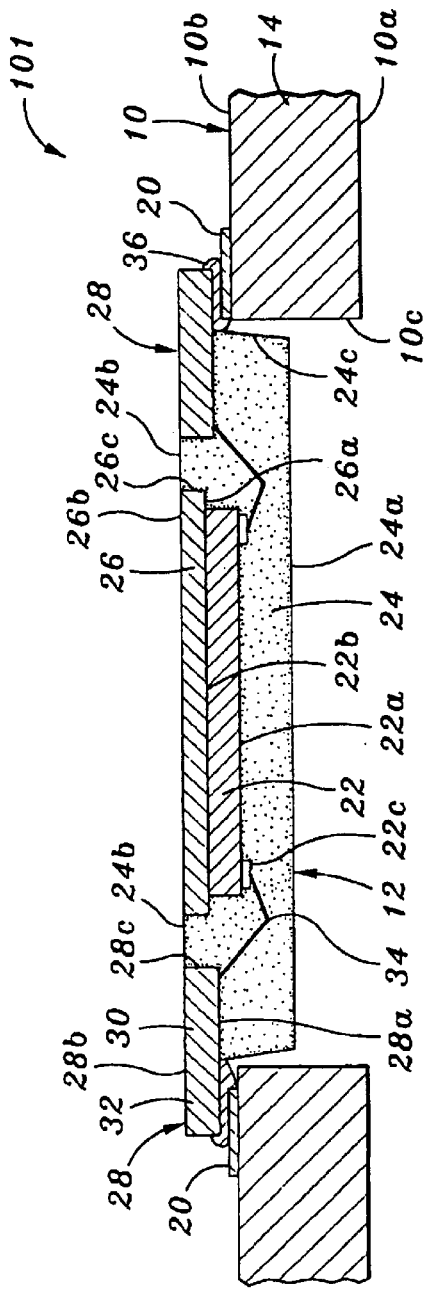
FIG. 1 is a cross-sectional side view of a mounting for a package.

FIG. 1 illustrates a mounting 101 in accordance with one embodiment of the present invention. Mounting 101 includes a semiconductor package 12 that is mounted on and electrically connected to an interconnective substrate 10, which may be a motherboard or some other type of electronic chassis.

Substrate 10 includes a core layer 14. For example, layer 14 may be a glass-fiber reinforced epoxy laminate sheet, a ceramic sheet, an insulated metal sheet, a film, or some other suitable material. Substrate 10 includes a first surface 10a and an opposite second surface 10b. A rectangular aperture 10c extends through substrate 10 between first surface 10a and second surface 10b. Conductive traces 20 (e.g., copper) are formed on second surface 10b. (The term "conductive trace" is used broadly to include any type of conductive terminals). Traces 20 carry electrical signals to and from package 12.

Semiconductor package 12 includes a semiconductor chip 22, a metal leadframe, and a body 24 of a hardened, insulative encapsulant material. The leadframe includes a metal die pad 26 and horizontal metal leads 28. Leads 28 each include an inner lead portion 30 that is within body 24, and an outer lead portion 32 that extends out of body 24 in the same horizontal plane as inner lead portion 30 and die pad 26. The leadframe may be formed of copper, copper alloy, steel, Alloy 42, or some other metal.

Chip 22 includes an active surface 22a where integrated circuit devices are formed, and an opposite inactive surface 22b. Active surface 22a includes a plurality of conductive bond pads 22c along the edges of active surface 22a. Bond pads 22c may be formed along two peripheral edges or all four peripheral edges of active surface 22a. Inactive surface 22b of chip 22 may be polished to make chip 22 thinner, thereby reducing package height.

Body 24 has a planar first surface 24a, an opposite planar second surface 24b, and peripheral side surfaces 24c. Typically, body 24 may be formed by molding or pouring and then curing a resin material (e.g., epoxy resin). Where body 24 is molded, as in this example, side surfaces 24c typically will be tapered to accommodate release from the mold.

Die pad 26 has a planar first surface 26a, an opposite second surface 26b, and peripheral side surfaces 26c. Inactive surface 22b of chip 22 is adhesively attached to first surface 26a. Second surface 26b of die pad 26 is exposed in the plane of second surface 24b of body 24. First surface 26a and side surfaces 26c of die pad 26 are covered by the encapsulant material of body 24. In an alternative embodiment, die pad 26 may be set up into body 24, i.e., out of the horizontal plane of leads 28 and second surface 24b of body 24, so that second surface 26b of die pad 26 is covered by the encapsulant material of body 24.

As mentioned, leads 28 are horizontal and include an inner lead portion 30 that is within body 24, and an outer lead portion 32 that is outside of body 24. Leads 28 have a first surface 28a, an opposite second surface 28b, and peripheral side surfaces between the first and second surfaces 28a, 28b. An inner end surface 28c of inner lead portion 30 of leads 28 faces die pad 26. The first surface 28a, peripheral side surfaces, and inner end surface 28c of inner lead portion 30 are covered with the encapsulant material of body 24. All of second surface 28b of lead 28 is exposed, including the portion of second surface 28b corresponding to inner lead portion 30. The peripheral side surfaces of inner lead portion 30 may include protruding anchor ears or the like, or an aperture may be formed vertically through inner lead portion 30, in order to prevent leads 28 from being pulled horizontally from body 24.

In a typical process for making package 12, a metal strip including an array of identical leadframes is processed in parallel. After each chip 22 is mounted on the die pad 26 of one of the leadframes and is electrically connected to the leads 28 of the respective leadframe, a body 24 is individually formed (e.g., molded) over each chip 22 and leadframe of the array. After the encapsulant material is cured, individual packages 12 are singulated from the metal strip by punching or sawing through the outer lead portion 30 of the leads 28 at a selected distance (e.g., 0.1 to 0.2 mm) from side surface 24c of body 24.

Practitioners will appreciate that package 12 has a reduced height, compared to the first conventional package mentioned above, because die pad 26 and leads 28 are provided at second surface 24b of package body 24.

Package 12 is electrically connected to traces 20 of second surface 10b of substrate 10 so that electrical signals may be passed between substrate 10 and chip 22 of package 12. In particular, each bond pad 22c of chip 22 is electrically connected by a conductor, e.g., a metal wire 34 made of gold or aluminum, to a first surface 28a of an inner lead portion 30 of a lead 28. Low loop bond wires or TAB bonds may be used to help reduce package height. In addition, the first surface 28a of each outer lead portion 30 is electrically connected by a conductor, such as metal solder 36, to metal traces 20 of substrate 10. Of course, these electrical connections may vary. For example, a conductive adhesive material, such as a metal-filled epoxy, may be used instead of solder 36 to electrically connect outer leads 32 to metal traces 20.

Package 12 is mounted on substrate 10 in a manner that significantly lessens a height of package 12 above second surface 10b of substrate 10, on which package 10 is mounted. In particular, package 12 is mounted so that most of body 24 of package 12 is within aperture 10c of substrate 10. First surface 24a of body 24 and a majority portion of side surfaces 24c of body 24 are within aperture 10c. Only die pad 26, leads 28, and second surface 24b of body 24 are above second surface 10b of substrate 10, thereby accomplishing a very low mounting height.

The height of package 10 of mounting 101 above second surface 10b of substrate 10 is about equal to the height (i.e., thickness) of die pad 26 and leads 28. In comparison to conventional mountings, height savings are realized by providing body 24 of package 10 within aperture 10c, providing die pad 26 and leads 28 at second surface 24b of body 24 rather than in the middle of body 24, and, if desired, by thinning chip 22 and by using low-loop height bond wires 34.

If desired, an additional electronic device (e.g., a package containing a chip, or a passive device such as a capacitor, resistor, or inductor) may be placed on package 12 and electrically connected thereto so that there is an electrical connection between the electronic device and second surface 28b of some or all of the leads 28, thereby electrically connecting package 12 to the additional electronic device.

Figure 2:
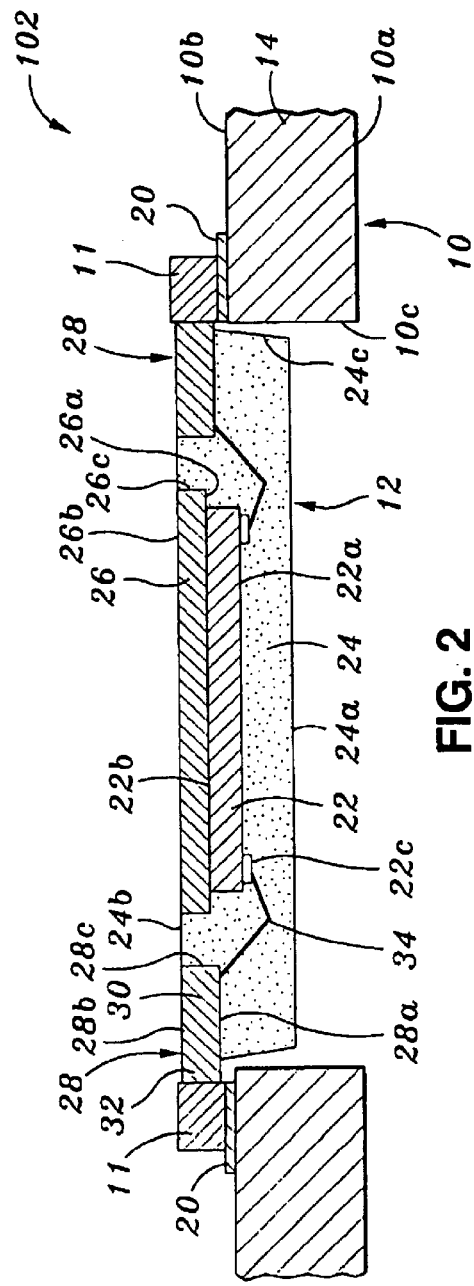
FIG. 2 is a cross-sectional side view of an alternative mounting for a package, wherein the mounting surface includes clips to fasten the package to the substrate.

FIG. 2 depicts a mounting 102 in accordance with another embodiment of the present invention. Mounting 102 is nearly the same as mounting 101 of Fig. 1, and thus does not need to be discussed in redundant detail. In mounting 102 of FIG. 2, clips 11 are provided on second surface 10b of substrate 10 adjacent to aperture 10c. Clips 11 each include an electrically conductive portion that is electrically connected to one of the traces 20 of second surface 10b. For example, each clip 11 may be metal, and may be soldered to one of the traces 20. Outer leads 32 of package 12 each snap into a respective one of the clips 11, thereby electrically connecting package 12 to substrate 10 without a soldered or otherwise adhesive connection.

FIG. 3 depicts a mounting 103 in accordance with another embodiment of the present invention. The difference between mounting 103 of FIG. 3 and mounting 101 of FIG. 1 is in the configuration of package 12. In contrast to FIG. 1, inner lead portion 30 of each lead 28 of package 12 of FIG. 3 is made longer, and the area of die pad 26 is reduced so as to fit within a boundary defined by bond pads 22c. Moreover, chip 22 is mounted in a flip chip style on first surface 26a of die pad 26 and first surface 28a of the inner lead portions 30. An insulative adhesive is used to attach first surface 22a of chip 22 to first surface 26a of die pad 26. Bond pads 22c of chip 22 face first surface 28a of the inner lead portions 30 and are electrically connected thereto with a conductive metal solder (e.g., a gold solder) or a conductive adhesive. In an alternative embodiment, die pad 26 may be omitted, such that chip 22 is supported in a flip chip style solely on first surface 28a of leads 28. In such an embodiment, encapsulant material of body 24 would fill in under active surface 22a of chip 22.

FIG. 4 depicts a mounting 104 in accordance with another embodiment of the present invention. Again, the difference between mounting 104 of FIG. 4 and mounting 101 of FIG. 1 is in the configuration of package 12. Die pad 26 and leads 28 of package 12 of FIG. 4 include a means for preventing die pad 26 and leads 28 from being pulled vertically from body 24. On die pad 26, this vertical locking feature includes an undercut region 26d at the periphery of die pad 26 that extends fully around, or extends at least along two opposing edges of, die pad 26. On leads 28, this vertical locking feature includes an undercut region 28d in second surface 28b of inner lead portion 30. Encapsulant material of body 24 fills in under undercut region 26d of die pad 26 and undercut region 28d of inner lead portion 30. The underfilled encapsulant material supports die pad 26 and leads 28 in body 24. Undercut regions 26d and 28d may be formed by masking and then etching about half way through the thickness of die pad 26 and leads 28 in the regions shown. In this regard, the reader is referred to U.S. patent application Ser. No. 09/176,614, which is incorporated herein by reference in its entirety.

Alternatively, instead of having half-etched regions, die pad 26 and leads 28 may have a stamped or coined circumferential lip at first surface 26a of die pad 26 and first surface 28a of lead 28. The lip circumscribes die pad 26, and extends along the side surfaces and inner end surface 28c of each lead 28. The lip ultimately is underfilled by encapsulant material of body 24, thereby vertically locking die pad 26 and leads 28 to body 24. Alternatively, side surfaces 26c of die pad 26 and the side surfaces and inner end surface 28c of leads 28 may include a central peak that extends into the encapsulant material or a central depression that is filled by the encapsulant material. In this regard, the reader is directed to U.S. Pat. No. 6,143,981, which is incorporated herein by reference in its entirety.

FIG. 5 depicts a mounting 105 in accordance with another embodiment of the present invention. Again, the difference between mounting 105 of FIG. 5 and mounting 101 of FIG. 1 is in the configuration of package 12. In particular, package 12 of FIG. 5 includes two chips 22 (e.g., two semiconductor memory chips) stacked one on top of the other. A spacer 40 is attached between the active surface 22a of a first chip 22 and the inactive surface 22b of a second chip 22 stacked on the first chip 22. Spacer 40 is fully within a perimeter defined by the bond pads 22c of the first chip 22, and spaces the second chip 22 above the bond wires 34 that are bonded to the bond pads 22c of the first chip 22. Spacer 40 may be formed of silicon with an insulative adhesive material coated on its opposing major surfaces, among other possibilities. The first and second chips 22 are electrically connected with each other through pairs of bond wires 34 that are connected to the same leads 28 of package 12. Alternatively, an adhesive film or a thick glob of an adhesive material may be between the chips so as to space them apart and attach them together.

FIG. 6 depicts a mounting 106 in accordance with another embodiment of the present invention. Again, the difference between mounting 106 of FIG. 6 and mounting 101 of FIG. 1 is in the configuration of package 12. In particular, package 12 of FIG. 5 provides a cavity 24d in body 24. First surface 26a of die pad 26 and first surface 28a of inner lead portion 30 of the leads 28 are exposed in cavity 24d. After forming body 24, a chip 22 is placed on first surface 26a of die pad 26 in cavity 24d, and is wire bonded to the exposed surface 28a of leads 28. A lid 42 is attached to the rim of cavity 24, thereby closing cavity 24d. Such a package may be appropriate where chip 22 is an optical device, in which case lid 42 is optically clear so as to transmit light to an optical cell on active surface 22a of chip 22. Alternatively, an optically clear encapsulant can be provided in cavity 24d in place of having a lid 42. Having a cavity 24d in body 24 also is appropriate where chip 22 is a micromachine or some other chip that cannot covered by an encapsulant material.

Figure 7:
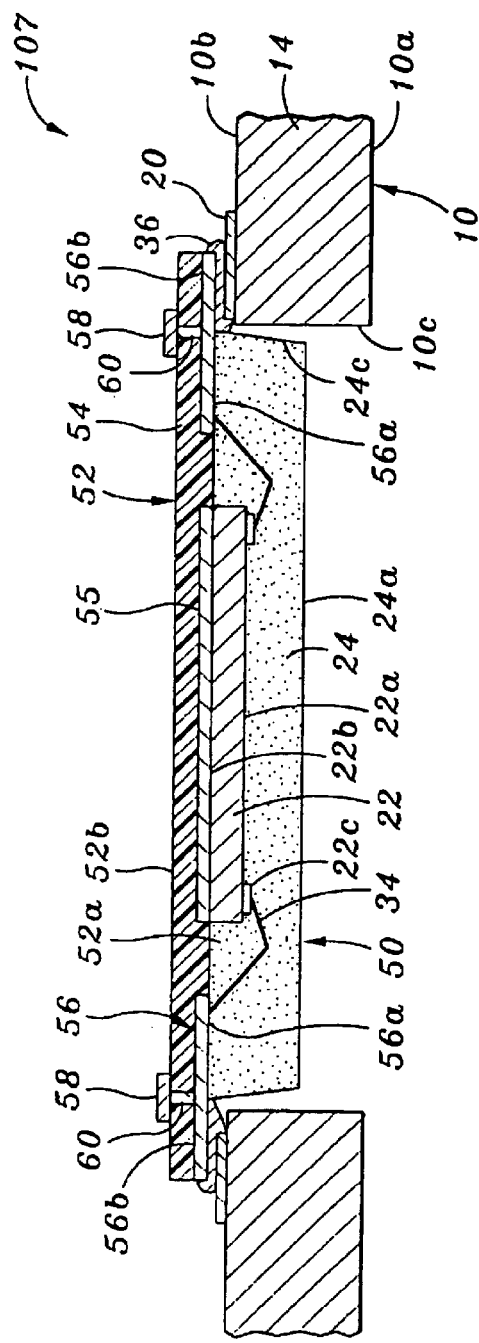
FIG. 7 is a cross-sectional side view of a mounting for an alternative package, wherein the package is leadless chip carrier package.

FIG. 7 depicts a mounting 107 in accordance with another embodiment of the present invention. Again, the difference between mounting 107 of FIG. 7 and mounting 101 of FIG. 1 is in the configuration of the package. In mounting 107 of FIG. 7, package 50 includes a substrate 52 that includes a layer of insulative material 54 (e.g., a polyimide film, a glass-fiber reinforced laminate sheet, or ceramic) upon which metal circuit patterns 56 are formed. A body 24 of an insulative encapsulant material is provided over a central region of a first surface 52a of substrate 52. A peripheral region of first surface 52a around body 24 is free of the encapsulant material. Chip 22 is attached to a metal die pad 55 on first surface 52a and is electrically connected to an encapsulated inner end 56a of the circuit patterns 56. An outer end 56b of each circuit pattern 56 is exposed at the periphery of first surface 52a outside of body 24. The outer end 56b of each circuit pattern 56 of package substrate 52 serves as an input/output terminal of package 50.

Body 24 of package 50 is positioned in aperture 10c of mounting substrate 10, just as in FIG. 1. The peripheral region of first surface 52a of substrate 52 is supported on first surface 10a of substrate 10 around aperture 10c. Outer end 56b of each of the circuit patterns 56 is connected by solder 36 or the like to one of the traces 20 on first surface 10a of substrate 10, thereby forming an electrical connection between package 50 and substrate 10. Accordingly, package 50 of mounting 107 has a very low height above second surface 10b of substrate 10. The height of package 50 of mounting 107 is approximately equal to the thickness of substrate 52 of package 50, since body 54 is in aperture 10c.

If desired, package 50 may include further metal input/output terminals 58 on second surface 52b of substrate 50. Input/output terminals 58 are electrically connected by vias 60 through substrate 50 to circuit patterns 56 on first surface 52a. Accordingly, another package could be stacked on second surface 52b if desired, and electrically connected to package 50 (and hence to substrate 10) through terminals 58.

In an alternative embodiment, package 50 may include a rectangular central aperture through substrate 52 within which chip 22 is located. In such a package, chip 22 would be supported and connected to substrate 52 by the encapsulant material of body 24. Such a package enjoys a very thin profile because chip 22 is in an aperture of substrate 52.

Figure 8:
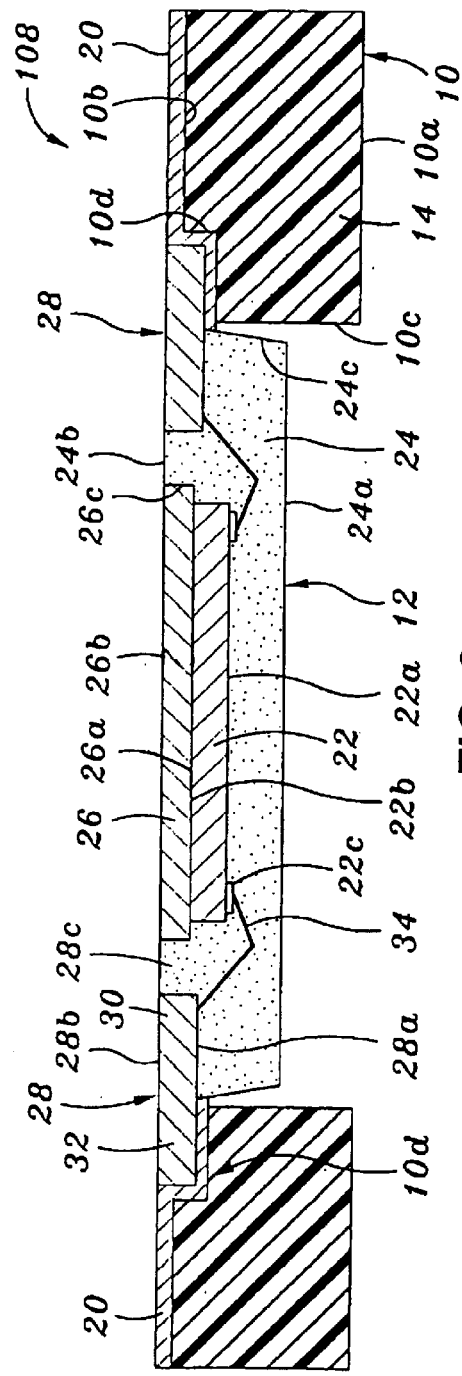
FIG. 8 is a cross sectional side view of another alternative mounting for a package, wherein the mounting surface includes channels for insertion of the outer portion of the leads of the package therein.

FIG. 8 depicts a mounting 108 in accordance with another embodiment of the present invention. The difference between mounting 108 of FIG. 8 and mounting 101 of FIG. 1 is in the connection of package 12 to substrate 10. In particular, substrate 10 of FIG. 8 includes a plurality of metal-lined channels 10d in second surface 10b around aperture 10c. The metal lining of each channel 10d is electrically connected to a trace 20 of first surface 10a. Channels 10d are formed so that outer leads 32 of package 10 can be fitted or snapped therein, thereby forming a solderless electrical connection between package 12 and substrate 10. Depending on the tightness of the fit, solder may be applied over leads 32 to make a more secure electrical connection to the metal lining of the respective channels 10d. Accordingly, with body 24 in aperture 10c and each outer lead 32 in a channel 10d, second surface 24b of body 24 of package 10 may be flush with or nearly flush with second surface 10b of substrate 10, depending on the depth of the channels 10b.

FIG. 9 depicts a mounting 109 in accordance with another embodiment of the present invention. In mounting 109, a second package 12 is stacked on the package 12 of FIG. 1 that is mounted on substrate 10. In particular, second surface 24b of body 24 of the upper package 12 is juxtaposed with and supported on the second surface 24 of body 24 of the lower package 12. Moreover, the exposed second surface 28b of each lead 28 of the upper package 12 is juxtaposed with and electrically connected by solder 36 or the like to the exposed second surface 28b of one of the leads 28 of the lower package 12, thereby electrically connecting the stacked packages 12. With the body 24 of the lower package 12 in aperture 10c of substrate 10, the height of the stack of packages 12 above mounting surface 10b of substrate 10 is less than the sum of the heights of the two packages 12 unstacked. Further reductions in height may be obtained, for example, by using channels 10d in substrate 10, as shown in FIG. 8. Mounting 109 may be made by mounting a first package 12 on substrate 10, as in FIG. 1, and then mounting a second package 12 on the first package 12. Alternatively, the two packages 12 can be electrically connected in a stack prior to electrically connecting the stack to substrate 10. In one application, the two packages may include identical memory chips, with one package arranged to be the mirror image of the other so that the chips therein may be electrically connected in parallel.

FIG. 10 depicts a mounting 110 in accordance with another embodiment of the present invention. Mounting 110 is the same as mounting 101 of FIG. 1, except that two packages 12 are independently mounted on opposing sides of substrate 10. In particular, a first package 12 is mounted on the surface 10b of substrate 10, as in FIG. 1, and a second package 12 is mounted on first surface 10a of substrate 10. The body 24 of each package 12 is in aperture 10c, such that their respective first surfaces 24a are juxtaposed. Substrate 10 must be sufficiently thick in this embodiment that each package will fit within aperture 10c. If desired, the two packages 10 may be electrically interconnected by providing metal vias through substrate 10 between the respective metal traces 20 of first surface 10a and second surface 10b. With both packages 12 in aperture 10c, a low combined height above mounting surfaces 10a, 10b is achieved while doubling the mounting density.

practitioners will appreciate that the embodiments described herein are exemplary only, and not limiting. The present invention includes all that fits within the literal and equitable bounds of the claims.

What is claimed is:

1. A mounting comprising:
   a substrate including a first mounting surface and an aperture through the substrate, wherein the first mounting surface includes conductive first traces adjacent to the aperture; and
   a first package including a base, a body of a hardened encapsulant material over a first side of the base, and a first chip within the body and electrically connected to input/output terminals of the first package,
   wherein the first side of the base is juxtaposed with the mounting surface, the body is within the aperture, and the input/output terminals of the first package each superimpose the first mounting surface and are electrically connected to a respective one of the first traces.

2. The mounting of claim 1, wherein the base of the first package is a metal leadframe, and a plurality of leads of the leadframe form the input/output terminals of the first package.

3. The mounting of claim 2, wherein the leads are horizontal and include an inner portion within the body and an outer portion outside of the body, and the inner portion of the leads is in a horizontal plane of a first exterior surface of the package.

4. The mounting of claim 3, wherein the inner portion of each of the leads of the first package includes a means for vertically locking the lead to the body.

5. The mounting of claim 1, wherein the mounting surface includes a plurality of channels adjacent to the aperture, and the input/output terminals of the package are each inserted into a respective one of the channels and are electrically connected therein to one of the first traces.

6. A mounting comprising:
   a substrate including a first mounting surface and an aperture through the substrate, wherein the first mounting surface includes conductive first traces adjacent to the aperture; and
   a first leadframe package including a body of a hardened encapsulant material, a chip within said body, and a plurality of horizontal metal leads, wherein each lead includes an inner portion within said body and an outer portion outside of the body, a first surface of the inner portion of the lead is electrically connected to the chip, and a second surface of the inner portion of the lead opposite to the first surface is exposed within a horizontal first exterior surface of the body;
   wherein the body of the package is within the aperture and the outer portion of each of the leads superimposes the first mounting surface and is electrically connected to a respective one of the first traces.

7. The mounting of claim 6, wherein the first leadframe package further includes a die pad upon which the chip is mounted.

8. The mounting of claim 6, wherein the first mounting surface includes a plurality of channels adjacent to the aperture, and the outer lead portion of each of the leads is in a respective one of the channels and is electrically connected therein to one of the first traces.

9. A method pf making a mounting, the method comprising:
   providing a first leadframe package including a body of a hardened encapsulant material, a chip within said body, and a plurality of horizontal metal leads, wherein each said lead includes an inner portion within said body and an outer portion outside of the body, and the inner portion of the leads includes a first surface electrically connected to the chip and an opposite second surface exposed in a plane of a horizontal first exterior surface of the body;

providing a substrate having a first mounting surface an aperture through the substrate, wherein the first mounting surface includes first traces adjacent to the aperture;

placing the first leadframe package on the substrate so that the body is within the aperture, and the outer portion of each of the leads superimposes a respective one of the first traces of the first mounting surface; and electrically connecting the outer portion of each of the leads to a respective one of the first traces.

10. The method of claim 9, wherein the first mounting surface includes a plurality of channels; and further comprising inserting the outer portion of each of the leads in a respective one of the channels and thereby electrically connecting the outer portion of the leads to the respective traces.

11. A mounting comprising:

a substrate including an aperture and electrically conductive portions adjacent to the aperture; and a chip package including a metal leadframe, a body of a plastic encapsulant material covering a portion of the leadframe, and a chip within said body;

wherein leads of the leadframe extend horizontally outward from the body, said leads being electrically coupled to the chip, the body of the package is within the aperture, and an outer portion of each of the leads overlies and is electrically coupled to the conductive portions of the circuit board.

12. The mounting of claim 11, wherein an exterior surface of the body and an exposed surface of each of the leads are coplanar.

13. The mounting of claim 12, wherein each of the leads further includes an inner portion which is at least partially within the body and electrically connected to the chip.

14. The mounting of claim 13, wherein the inner portion of each of the leads includes a first surface which is electrically connected to the chip and a second surface which is opposite the first surface and extends in generally co-planar relation to the exterior surface of the body.

15. The mounting of claim 13, wherein the inner portion of each of the leads includes a means for vertically locking the lead to the body.

16. The mounting of claim 11, wherein the leadframe further includes a die pad upon which the chip is mounted.

17. The mounting of claim 11, wherein the substrate includes a plurality of channels, and the outer portions of the leads are inserted into respective ones of the channels and electrically connected therein to the conductive portions of the substrate.

* * * * *